United States Patent [19]
Tasaka

[11] Patent Number: 5,911,106
[45] Date of Patent: Jun. 8, 1999

[54] SEMICONDUCTOR MEMORY DEVICE AND FABRICATION THEREOF

[75] Inventor: Kazuhiro Tasaka, Tokyo, Japan

[73] Assignee: NEC Corporation, Japan

[21] Appl. No.: 08/920,460

[22] Filed: Aug. 29, 1997

[30] Foreign Application Priority Data

Aug. 29, 1996 [JP] Japan ................................... 8-228003

[51] Int. Cl.⁶ .............................................. H01L 21/8236
[52] U.S. Cl. ........................... 438/276; 438/262; 438/546
[58] Field of Search .................................... 438/257, 262, 438/275, 276, 302, 306, 305, 450, 545, 546, 551, 552; 257/336

[56] References Cited

U.S. PATENT DOCUMENTS

| | | | |
|---|---|---|---|
| 4,780,424 | 10/1988 | Holler et al. | 438/262 |
| 4,839,301 | 6/1989 | Lee | 438/450 |
| 4,939,568 | 7/1990 | Kato et al. | 357/75 |
| 4,968,639 | 11/1990 | Bergonzoni | 438/305 |
| 4,997,782 | 3/1991 | Bergonzoni | 438/227 |
| 5,187,550 | 2/1993 | Yanagisawa | 257/301 |
| 5,270,944 | 12/1993 | Kuroda, et al. | 364/490 |
| 5,350,703 | 9/1994 | Lee | 437/48 |
| 5,365,097 | 11/1994 | Kenney | 257/302 |
| 5,480,819 | 1/1996 | Huang | 438/306 |
| 5,556,798 | 9/1996 | Hong | 438/257 |
| 5,556,800 | 9/1996 | Takizawa et al. | 437/45 |
| 5,580,799 | 12/1996 | Funaki | 438/302 |
| 5,610,092 | 3/1997 | Tasaka | 437/48 |
| 5,635,417 | 6/1997 | Natsume | 438/130 |
| 5,641,694 | 6/1997 | Kenney | 438/156 |

*Primary Examiner*—Charles Bowers
*Assistant Examiner*—Jack Chen

[57] ABSTRACT

A fabrication process of a mask ROM is disclosed, which process is effective to suppress the occurrence of punch-through of a memory cell transistor. According to the process, the surface of a P conductivity-type silicon substrate is subjected to thermal oxidation to grow oxides to form a pad oxide film. A silicon nitride film, which acts as an oxidation resisting film, is deposited on the pad oxide film. A resist is formed on the silicon nitride film. The resist has openings where bit lines are to extend. Using the resist as a mask, the silicon nitride film is selectively etched away. Using the resist as a mask, ions of arsenic (As) are introduced by ion implantation to the substrate for formation of N conductivity-type diffusion regions in the subsequent thermal oxidation. These N conductivity-type diffusion regions act as the bit lines. Using the resist as a mask, ions of boron (B) are introduced by ion implantation for formation of P⁺ conductivity-type diffusion regions in the subsequent thermal oxidation. During the thermal oxidation, the P⁺ conductivity-type diffusion regions surround the N conductivity-type diffusion regions, and field oxide regions are formed on the N conductivity-type diffusion regions. The silicon nitride layer and the pod oxide layer thereunder are removed. Gate oxide regions are formed. Word lines of a polycide are formed on the gate oxides regions. The word lines extend orthogonal to a direction in which the N conductivity-type diffusion regions (bit lines) extend.

6 Claims, 6 Drawing Sheets

FIG. 4 (a) PRIOR ART
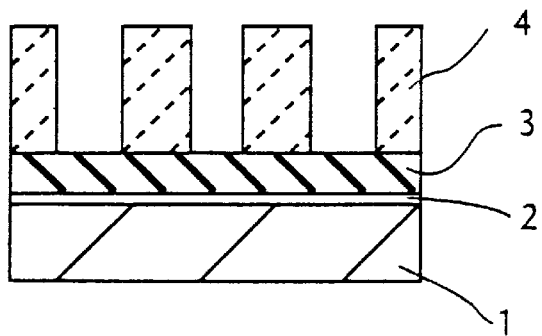
FIG. 4 (b) PRIOR ART
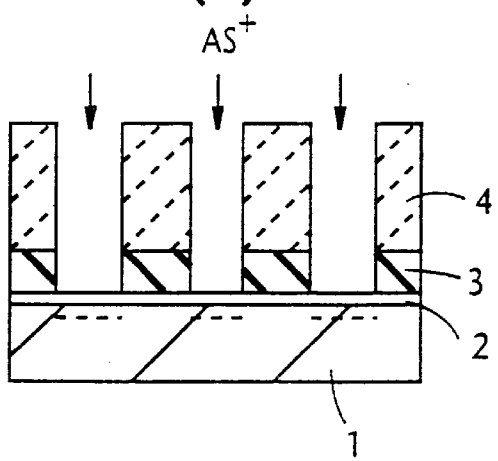
FIG. 4 (c) PRIOR ART
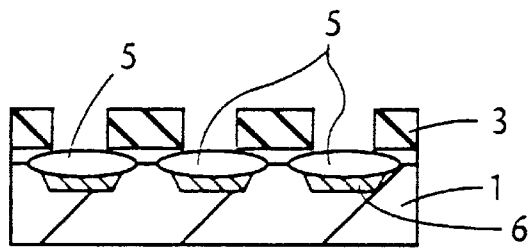
FIG. 4 (d) PRIOR ART
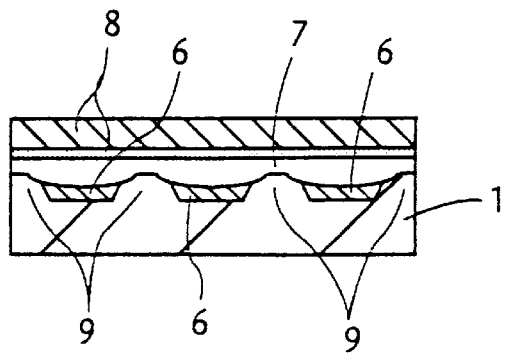

SEMICONDUCTOR MEMORY DEVICE AND FABRICATION THEREOF

BACKGROUND OF THE INVENTION

1. Field of the Invention

The present invention relates to a semiconductor memory device and a fabrication thereof, and more particularly to a mask read-only memory (ROM) and a fabrication thereof.

2. Description of the Related Art

Mask ROMs can be classified into NAND-type ROMs and NOR-type ROMs. It had been considered that NOR-type ROMs were superior in terms of operation speed, but difficult to shrink in size to meet high-density requirement for integrated circuit (IC) applications. A great advancement toward solution of this problem has been made in flat NOR-type ROMs by forming bit fines with diffusion to establish contact free electrical connection and by eliminating element separating regions in array configuration of memory cells.

Referring to FIGS. 3, 4(a), 4(b), 4(c) and 4(d), a fabrication process of a flat NOR-type mask ROM is described. FIG. 3 is a schematic top plan view of an array configuration of memory cells of the flat NOR-type mask ROM. FIGS. 4(a), 4(b), 4(c) and 4(d) are cross sections taken through the line 4—4 of FIG. 3, illustrating fabrication process steps.

Viewing in FIG. 3, bit lines 6 of diffusion regions or an N conductivity type formed in a silicon substrate of a P conductivity type extend in a vertical direction, and word lines 8 are disposed above and extend orthogonal to the direction of the bit lines 6. The word lines 8 are made of a polycide structure that is a laminate structure of a lower polycrystalline silicon layer and an upper slicide layer. Below each of the word lines 8 and between the adjacent two bit lines 6 is formed a channel of a memory cell transistor.

In fabrication, as shown in FIG. 4(a), the surface of a silicon substrate 1 of P conductivity type is subjected to oxidation to grow oxides to form a pad oxide film 2 and a silicon nitride film 3 is deposited on the film 2. The silicon nitride film 3 acts as an oxidation resisting film. A resist (photoresist) 4 is formed on the silicon nitride film 3. The resist 4 has openings where diffusion regions of N conductivity, which act as bit lines, are to extend. The silicon nitride film 3 is selectively removed, as shown in FIG. 4(b), by anisotropic etching technique with the resist 4 as a mask. Using the resist 4 as a mask, ion implantation is performed to introduce dopant of N conductivity type, such as arsenic (As), into the substrate 1 to form dopant implanted portions. In FIG. 4(c), after the resist 4 has been removed, selective oxidation is performed with the silicon nitride film 3 as a mask. In the selective oxidation, the implanted dopant atoms are diffused to form dopant diffusion regions 6 of N conductivity and field oxide regions 5 are formed on the dopant diffusion regions 6. These dopant diffusion regions 6 act as bit lines, respectively.

Referring to FIG. 4(d), after removing the silicon nitride film 3 and pad oxide film 2 to expose surface portions of the silicon substrate 1, gate oxide regions 7 are formed on the exposed surface portions of the silicon substrate 1. Subsequently, a laminated structure of a lower polycrystalline silicon film and an upper tungsten silicide (WSi) film is deposited over the whole surface of the assembly, and patterned to define word lines 8. Formed below each of the word lines 8 and between the adjacent two of the N conductivity-type diffusion regions 6 (bit lines) is a channel 9.

Subsequently, an interlayer film is deposited, and a predetermined dopant of P conductivity such as boron (B) is introduced into the channel portion of each of the predetermined ones of the memory cell transistors through the interlayer film by ion implantation. After the step of writing information, wiring lines are formed to provide a flat NOR-type mask ROM having memory cell transistors, each having a channel length L and a channel width W.

In the conventional flat NOR-type mask ROMs, leaks between adjacent elements and punch-through between the source and drain (between diffusion regions of N conductivity type) tend to occur. Thus, it is difficult to reduce the minimum Lmin of the channel length of each memory cell transistor to a dimension sufficiently small enough to allow memory cells to shrink in size to meet high-density requirement for integrated circuit (IC) applications.

An object of the present invention is to improve a flat NOR-type mask ROM by suppressing leaks between the adjacent elements and punch-through between the source and drain. This reduces the minimum Lmin of the channel of a memory cell transistor to a dimension sufficiently small enough to allow memory cells to shrink in size to meet high-density requirement for integrated circuit (IC) applications.

SUMMARY OF THE INVENTION

The object is accomplished by ion implantation of dopant atoms that induce the same conductivity type as a semiconductor substrate. The implanted portions are produced around a predetermined projected range (Rp). The predetermined projected range is determined such that, in the subsequent thermal oxidation, the implanted dopant atoms are diffused to produce dopant diffusion regions at boundaries between each channel and the adjacent two diffusion regions of the opposite conductivity type to the substrate.

The opposite conductivity type diffusion regions act as bit lines, respectively, and include another dopant atoms that have been introduced by ion implantation. Both of the ion implantation processes are performed using a resist layer as a common implantation mask.

Assuming now that a semiconductor substrate is of a P conductivity type, N conductivity-type dopant atoms are introduced into the substrate to form first implanted portions and P conductivity-type dopant atoms, e.g. boron (B), are introduced to form second implanted portions. Using a resist layer as a common ion-implantation mask, an ion-implantation is performed to form the first implanted portions around a first projected range (Rp) and to form the second implanted portions around a second projected range (Rp) that is deeper than or equal to the first projected range. Boron has a larger diffusion coefficient than the N conductivity-type dopant atoms. In the subsequent thermal oxidation, the implanted boron atoms are distributed into $P^+$ conductivity-type diffusion regions that extend to define boundaries between a channel and the adjacent two of the N conductivity-type diffusion regions. The N conductivity-type diffusion regions act as bit lines, respectively.

This arrangement restrains depletion region from extending beyond each of the N conductivity-type diffusion regions, thus suppressing the occurrence of punch-through effect. This makes a great contribution to a reduction of the channel length of each memory cell transistor.

The $P^+$ conductivity-type diffusion regions act as a channel stop, thus suppressing leak between the adjacent elements.

Without using costly photolithography technique, the present invention relies on less costly ion implantation or the dopant atoms of the same conductivity type as a substrate to accomplish the suppression of occurrence of punch-through and the suppression of leak, thus minimizing a fabrication cost increase.

According to one aspect of the present invention, there is provided a method of fabricating a semiconductor memory device, the method comprising the steps of;

providing a substrate of a first conductivity type;

forming a pad oxide film in said substrate and an oxidation resisting film on said pad oxide film;

forming a resist over the whole surface area of said oxidation resisting film, said resist having openings where bit lines are to extend;

selectively etching away said oxidation resisting film using said resist as a mask;

introducing, using said resist as a mask, a first dopant of a second conductivity type opposite to the first conductivity type into said substrate to produce first dopant implanted portions around a first projected range;

introducing, using said resist as a mask, a second dopant of the first conductivity type into said substrate to produce second dopant implanted portions around a second projected range that is deeper than or equal to said first projected range;

removing said resist;

performing thermal oxidation using said oxidation resisting film as a mask to accelerate diffusion of said first dopant in said first dopant implanted portions and diffusion of said second dopant in said second dopant implanted portions to form first dopant diffusion regions and second dopant diffusion regions, respectively, and also to form field oxide regions;

removing said oxidation resisting film and said pad oxide film thereunder to expose surface portions of said substrate;

forming gate oxide regions on said exposed surface portions of said substrate; and forming word lines that are orthogonal to a direction in which said first dopant diffusion regions extend on said gate oxide regions and said field oxide regions.

According to another aspect of the present invention, there is provided a semiconductor memory device, comprising:

a substrate of a first conductivity type;

a plurality of first diffusion regions in which atoms of a first dopant of a second conductivity type opposite to the first conductivity type are diffused, said first diffusion regions being disposed in said substrate and spaced one after another to define a channel between the adjacent two thereof;

a plurality of second diffusion regions in which atoms of second dopant of the first conductivity type are diffused, said second diffusion regions being disposed in said substrate and defining two boundaries of each of said channels with the adjacent two of said first diffusion regions;

a plurality of gate oxide regions on said channels; and a plurality of word lines extending orthogonal to a direction in which said first diffusion regions extend.

BRIEF DESCRIPTION OF THE DRAWINGS

FIGS. 4(a), 4(b), 4(c), and 4(d) are cross-sectional views of the mask ROM taken during successive steps in a fabrication process discussed before, wherein FIG. 4(d) is a cross-sectional view taken through the line 4—4 of FIG. 3.

DETAILED DESCRIPTION OF THE INVENTION

Figure 1:
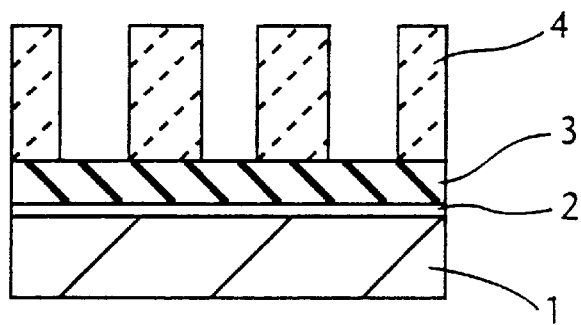
FIGS. 1(a), 1(b), 1(c), 1(d), and 1(e) are cross-sectional views of a first embodiment of a mask ROM taken during successive steps in a fabrication process according to the present invention.
Figure 1:
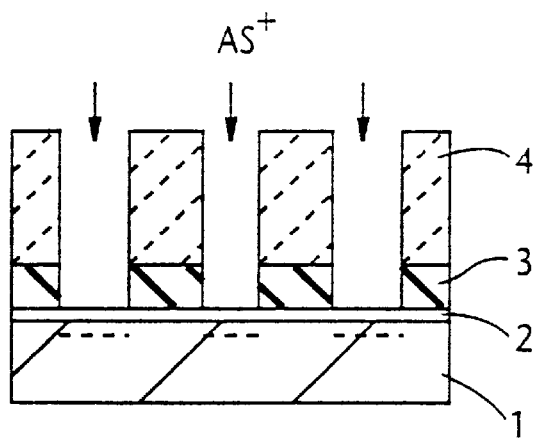
Figure 1:
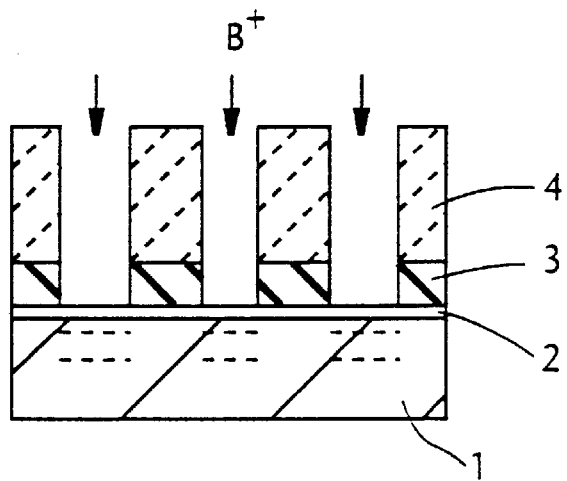
Figure 1:
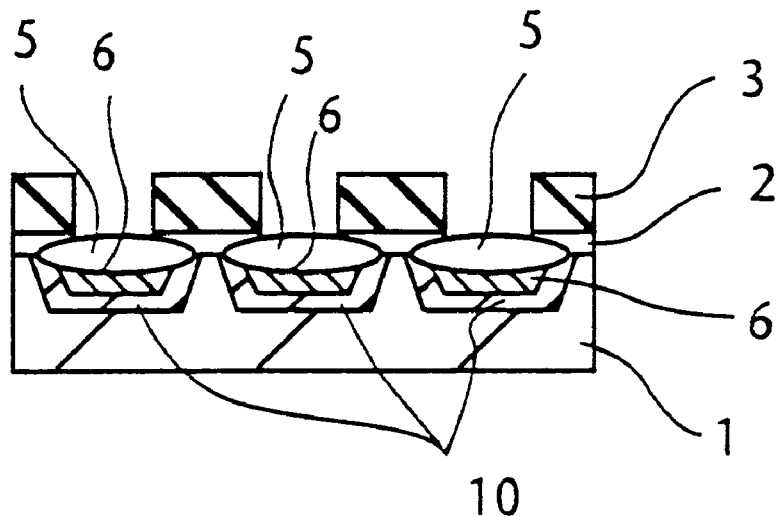
Figure 1:
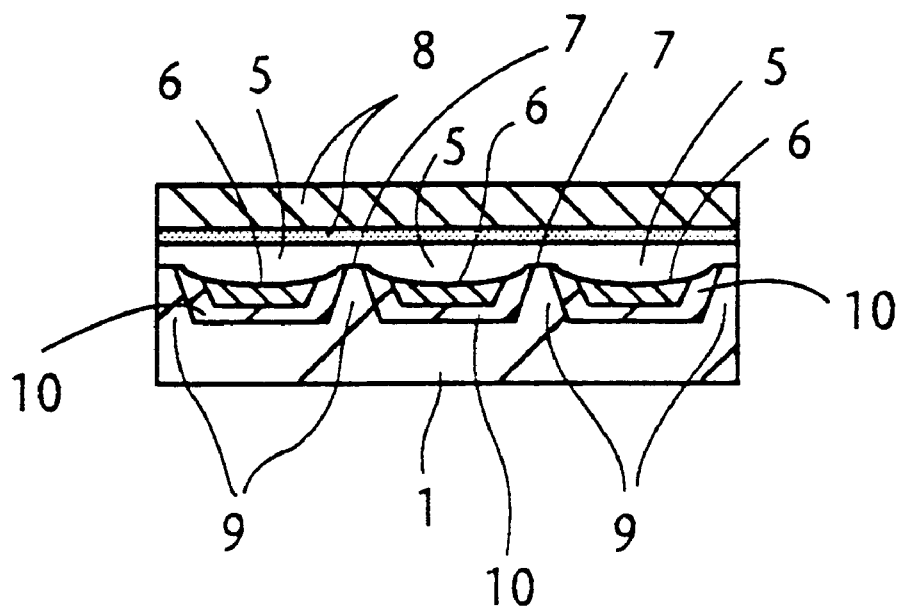

In the following description and accompanying drawings, the same reference numerals are used throughout multiple figures to designate the same or similar components.

Figure 3:
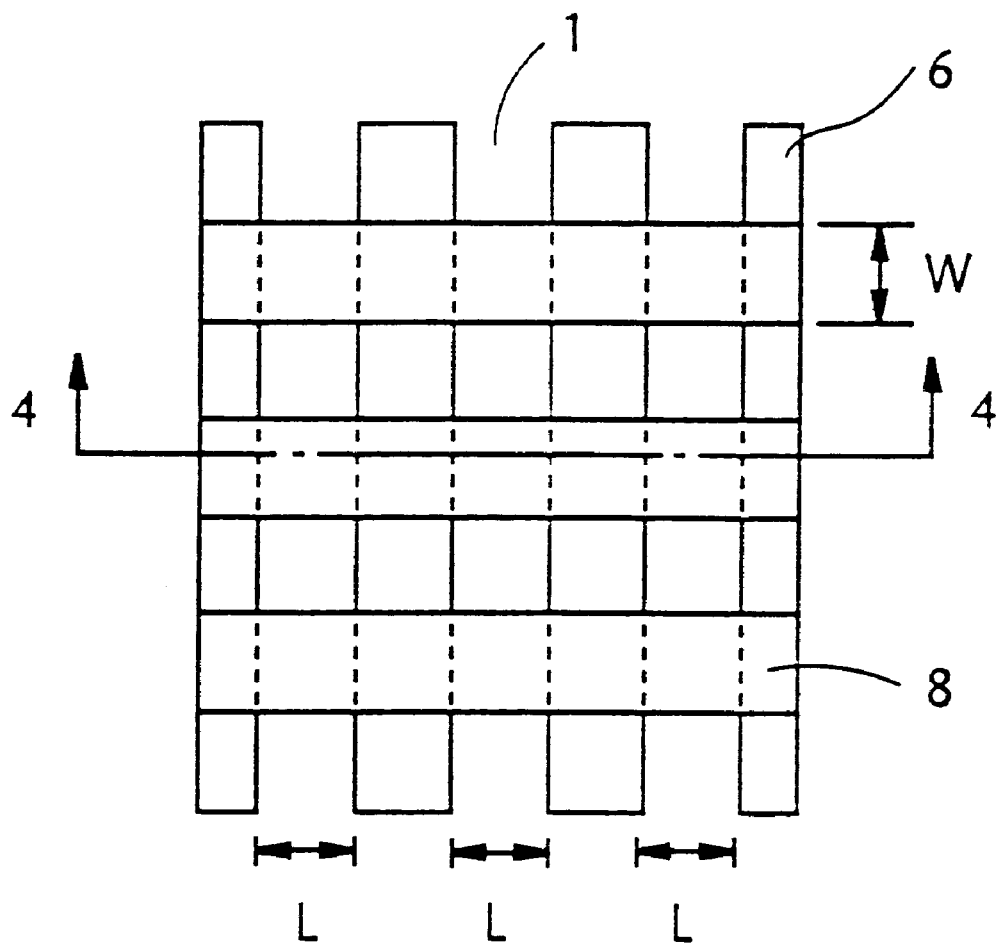
FIG. 3 is a top plan view of a conventional NOR type mask ROM.

A first embodiment of a NOR type mask ROM pursuant to the present invention is shown in FIG. 1(e). FIG. 1(e) shows a cross-section taken through the line 4—4 of FIG. 3. A semiconductor substrate 1 has a first conductivity type. In this embodiment, a silicon substrate of a P conductivity type is used as the substrate 1. Mutually spaced diffusion regions 6, which include implanted first dopant atoms of a second conductivity type opposite to the first conductivity type, are formed in the substrate 1. The diffusion regions are spaced one from another and extend in parallel in one direction, and act as bit lines 6, respectively. In this embodiment, ions of arsenic (As) are introduced by ion implantation into the substrate 1 and thus the diffusion regions 6 have an N conductivity type. Filed oxide regions 5 exist on the N conductivity-type diffusion regions 6, respectively. Gate oxide regions 7 exist on the surface portions of the substrate 1 that are not covered by the field oxide regions 5. Each of the gate oxide regions 7 overlies a channel that is defined between the adjacent two N type diffusion regions 6 and below each of word lines 8. Each of the word lines 8 is a laminate structure of a polycrystalline layer deposited on the surface of the assembly and a tungsten suicide (WSi) layer deposited on the surface of the polycrystalline layer. The word lines 8 extend orthogonal to the direction of the bit lines 6.

Diffusion regions 10, which include implanted second dopant atoms of the same conductivity type as the substrate 1, are formed in the substrate 1. In this embodiment, ions of boron (B) are implanted by ion implantation into the substrate 1 and thus the diffusion regions 10 have a $P^+$ conductivity type. The $P^+$ conductivity-type diffusion regions 10 surround the N conductivity-type diffusion regions 6, respectively, to define boundaries between each of the channels 9 and the adjacent two of the N conductivity-type diffusion regions 6.

It is now understood that two boundaries of each of the channels 9 and the adjacent two N conductivity-type diffusion regions 6 are defined by two $P^+$ conductivity-type diffusion regions 10 that surround the adjacent two N conductivity-type diffusion regions 6, respectively. This arrangement is found to be effective in suppressing the occurrence of punch-through effect and suppressing leak between the adjacent elements.

One fabrication process for a semiconductor memory device such as depicted in FIG. 1(e) is discussed with reference to FIGS. 1(a) to 1(e).

Referring first to FIG. 1(a), processing assumes provision of a silicon substrate 1 of a P conductivity-type. The surface of the silicon substrate 1 is subjected to steam oxidation at temperature falling in a range from 800 to 900° C. to form a pad oxide film 2 of 100 to 250 Angstroms thick. Low-pressure chemical vapor deposition (LPCVD) is used to form 1000 to 2000 Angstroms thick silicon nitride film 3. The silicon nitride film 3 acts as an oxidation resisting film. Optical lithography is used to form a resist 4 on the silicon nitride film 3. The resist 4 has a plurality of openings with a width ranging from 0.2 to 0.4 µm. These openings are regularly spaced one after another with a pitch that ranges from 0.4 to 0.8 µm.

Referring to FIG. 1(b), the silicon nitride film 3 is selectively removed by anisotropic etching using the resist 4 as a mask. As the selectivity, i.e., a ratio of the etch rate of the silicon nitride film 3 to the etch rate of the pad oxide film 2, is poor, it is highly possible that the pad oxide film 2 may be also etched away. Thus, the pad oxide film 2 may not remain. This does not pose any problem, however.

Using the resist 4 as an ion implantation mask, atoms of an N conductivity-type dopant impurity such as arsenic (As) are introduced into the substrate 1 by ion implantation. Implantation energies range from 50 to 70 keV and doses range from 1E15 to 4E15 cm$^{-2}$. The axis of incidence of ion beam is perpendicular to the target surface. In other words, the incidence angle is zero.

Referring to FIG. 1 (c), using the resist 4 as an ion implantation mask, atoms of a P conductivity-type dopant impurity such as boron (8) are introduced into the substrate 1 by ion implantation. Implantation energies range from 60 to 100 keV and doses range from 2E13 to 1E14 cm$^{-2}$. The axis of incidence of ion beam is perpendicular to the target surface. In other words, the incidence angle is zero.

Implantation energies and doses must be chosen such that the projected range (Rp) of boron is deeper then the projected range (Rp) of arsenic. If desired, the order of these ion implantation processes may be reversed.

Referring to FIG. 1 (d), the resist 4 is removed. Using the silicon nitride layer 3 as a mask, the assembly is subjected to steam oxidation at 850° C. to produce field oxide regions 5, N conductivity-type diffusion regions 6 below the field oxide regions 5, and P$^+$ conductivity-type diffusion regions 10. With dose of 1E15 cm$^{-2}$ during ion implantation of atoms of arsenic, the field oxide regions 5 are around 0.1 µm thick. Atoms of boron are implanted more deeply than atoms of arsenic and boron has a greater diffusion coefficient than arsenic. Thus, the P$^+$ conductivity-type diffusion regions 10 grow to completely surround the N conductivity-type diffusion regions 6, respectively.

Referring to FIG. 1(e), the silicon nitride film 3 and the pad oxide film 2 are removed to expose the surface portions of the substrate 1. These surface portions are subjected to thermal oxidation to grow oxides to form gate oxide regions 7. Subsequently, a polycrystalline silicon film and a tungsten silicide film are deposited on the surface of the assembly in this order to form a laminate structure. This laminate structure is patterned to define word lines 8 that are orthogonal to the direction of bit lines defined by the N conductivity-type diffusion regions 6.

Subsequently, an interlayer film is deposited, and a P conductivity-type dopant such as boron (B) is introduced into the channel of each of the predetermined ones of the memory cell transistors through the interlayer film by ion implantation. After the step of writing information, wiring lines are formed to provide a flat NOR-type mask ROM having memory cell transistors, each having a channel length L and a channel width W (see FIG. 3).

Figure 2:
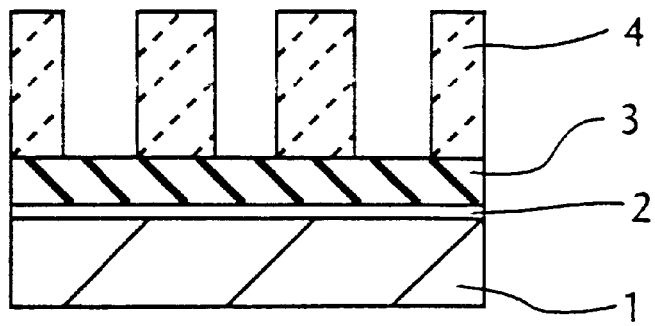
FIGS. 2(a), 2(b), 2(c), 2(d), and 2(e) are cross-sectional views of a second embodiment of a mask ROM taken through during successive steps in a fabrication process according to the present invention.
Figure 2:
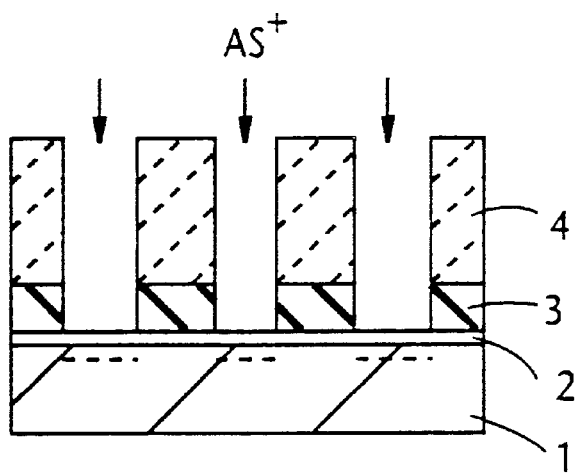
Figure 2:
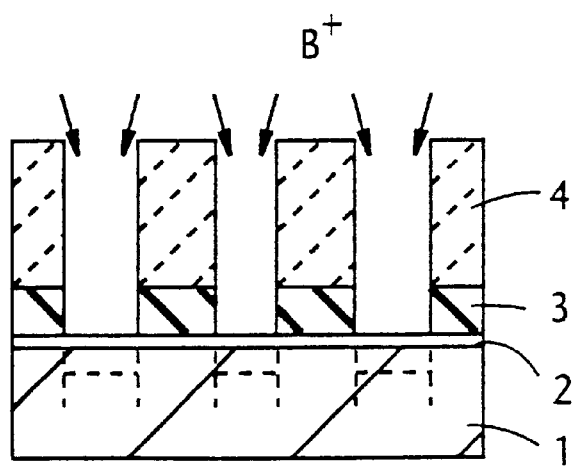
Figure 2:
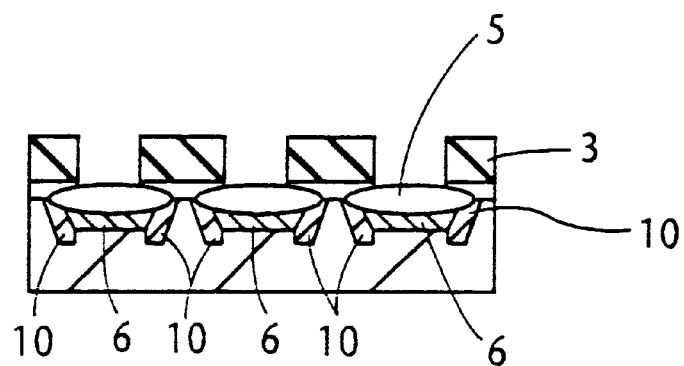
Figure 2:
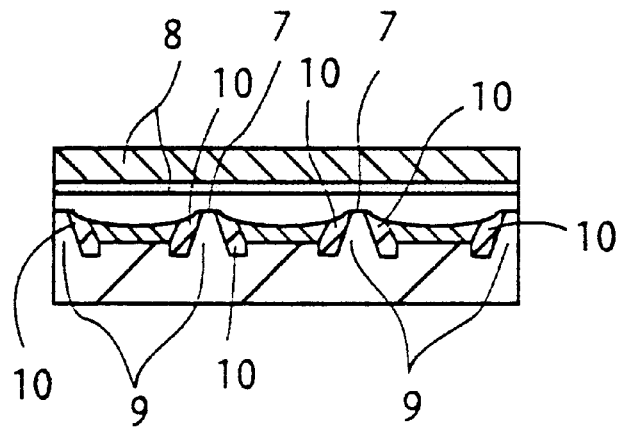

A second embodiment of a NOR type mask ROM pursuant to the present invention is shown in FIG. 2(e). FIG. 2(e) shows a cross-section taken through the line 4—4 of FIG. 3. This second embodiment is substantially the same as the first embodiment except the arrangement of P$^+$ conductivity-type diffusion regions 10. In the first embodiment, each of the P$^+$ conductivity-type diffusion regions 10 surrounds the whole surface of one of N conductivity-type diffusion regions 6. However, in the second embodiment, two P$^+$ conductivity-type diffusion regions 10 cover two side surface portions of each of the N conductivity-type diffusion regions 6, respectively, with the other surface portion left uncovered. In other words, according to the second embodiment, what are covered by the P$^+$ conductivity-type diffusion regions 10 are only the side portions of the adjacent two of the N conductivity-type diffusion regions 6 that are spaced from each other in opposed relationship to interpose a channel 9. This arrangement according to the second embodiment is advantageous over the first embodiment in that parasite capacitance around each of the N conductivity type regions 6 has been reduced. This has resulted in improvement in operation speed.

One fabrication process for a semiconductor memory device such as depicted in FIG. 2(e) is discussed with reference to FIGS. 2(a) to 2(e). This process is substantially the same as the process illustrated in FIGS. 1(a) to 1(e), but differs from the latter only in that ion beams of boron (B) arrive at the target surface at predetermined incidence angles, respectively.

Referring to FIG. 2(c), the incidence angle of first ion beam of boron (B) is greater than 0 (zero), and the incidence angle of second ion beam of boron (B) is less than 0 (zero) degree.

Thus, referring to FIG. 2(d), what are covered by the P$^+$ conductivity-type diffusion regions 10 are only the side portions of the adjacent two of the N conductivity-type diffusion regions 6 that are spaced from each other in opposed relationship to interpose a channel 9. This has reduced the surface area of each of the N conductivity-type regions that is covered by the P$^+$ conductivity-type diffusion regions 10. Parasite capacitance around each of the N conductivity-type regions 6 has been reduced. This has resulted in improvement in operation speed.

Assume now that the depth of oxides of the pad oxide film 2 is 0.02 µm, the thickness of the silicon nitride film 3 is 0.12 µm, the thickness of the resist 4 is 1.0 µm, and the width of each of the openings is 0.4 µm. Under these conditions, the incidence angle (θ) of first ion beam of boron (B) is greater than 0 (zero) but not greater than 18 degrees and that of second ion beam of boron (B) is less than 0 (zero but not less than −18 degrees.

What is claimed is:

1. A method of fabricating a semiconductor memory device, the method comprising the steps of:

providing a substrate of a first conductivity type;

forming a pad oxide film on said substrate and an oxidation resisting film on said pad oxide film;

forming a resist over the whole surface area of said oxidation resisting film, said resist having openings where bit lines are to extend;

selectively etching away said oxidation resisting film using said resist as a mask;

introducing, using said resist as a mask, a first dopant of a second conductivity type opposite to the first conductivity type into said substrate to produce first dopant implanted portions around a first projected range;

introducing, using said resist as a mask, a second dopant of the first conductivity type into said substrate to produce second dopant implanted portions around a second projected range that is deeper than or equal to said first projected range;

removing said resist;

performing thermal oxidation using said oxidation resisting film as a mask to accelerate diffusion of said first dopant in said first dopant implanted portions and diffusion of said second dopant in said second dopant implanted portions to form first dopant diffusion regions and second dopant diffusion regions, respectively, and also to form field oxide regions;

removing said oxidation resisting film and said pad oxide film thereunder to expose surface portions of said substrate;

forming gate oxide regions on said exposed surface portions of said substrate; and forming word lines that are orthogonal to a direction in which said first dopant diffusion regions extend on said gate oxide regions and said field oxide regions.

2. The method as claimed in claim 1, wherein said first dopant is arsenic (As) and said second dopant is boron (B).

3. The method as claimed in claim 1, wherein, during said second dopant introducing step, said second dopant is directed toward a target surface of said substrate at an angle with respect to an axis perpendicular to the target surface.

4. The method as claimed in claim 1, wherein said second dopant has a greater diffusion coefficient than said first dopant.

5. The method as claimed in claim 1, wherein said oxidation resisting film is formed of silicon nitride.

6. The method as claimed in claim 1, wherein the introduced second dopant of the first conductivity type is produced around the second projected range so that, in the subsequent thermal oxidation step, the second dopant is diffused to produce dopant regions at boundaries between adjacent first dopant diffusion regions and channels formed between the adjacent first dopant diffusion regions.

* * * * *